(12) United States Patent
Bang et al.

(10) Patent No.: US 10,916,589 B2
(45) Date of Patent: Feb. 9, 2021

(54) ELECTROLUMINESCENT DISPLAY DEVICE

(71) Applicant: LG DISPLAY CO., LTD., Seoul (KR)

(72) Inventors: Hyung-Seok Bang, Paju-si (KR); Ji-Yeon Park, Paju-si (KR); Han-Sun Park, Paju-si (KR); Hyeong-Jun Lim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 51 days.

(21) Appl. No.: 16/218,435

(22) Filed: Dec. 12, 2018

(65) Prior Publication Data

US 2019/0189701 A1 Jun. 20, 2019

(30) Foreign Application Priority Data

Dec. 18, 2017 (KR) .................. 10-2017-0173903

(51) Int. Cl.
*H01L 27/32* (2006.01)
*G02F 1/1335* (2006.01)
*H01L 51/52* (2006.01)
*G03H 1/02* (2006.01)

(52) U.S. Cl.
CPC .... *H01L 27/3209* (2013.01); *G02F 1/133526* (2013.01); *G03H 1/02* (2013.01); *H01L 27/322* (2013.01); *H01L 27/3211* (2013.01); *H01L 27/3246* (2013.01); *H01L 27/3258* (2013.01); *H01L 51/5206* (2013.01); *H01L 51/5221* (2013.01); *H01L 51/5237* (2013.01); *H01L 51/5265* (2013.01); *H01L 51/5271* (2013.01);

(Continued)

(58) Field of Classification Search
CPC ................ G02F 1/133526; G03H 1/02; G03H 2001/0216; H01L 2251/5315; H01L 27/3209; H01L 27/3211; H01L 27/322; H01L 27/3246; H01L 27/3258; H01L 51/5206; H01L 51/5221; H01L 51/5237; H01L 51/5265; H01L 51/5271
See application file for complete search history.

(56) References Cited

U.S. PATENT DOCUMENTS

2008/0169757 A1* 7/2008 Chang ................. H01L 27/3211
313/504
2014/0183460 A1* 7/2014 Kim .................... H01L 51/5265
257/40

(Continued)

*Primary Examiner* — Kenneth Bukowski
(74) *Attorney, Agent, or Firm* — Polsinelli PC

(57) ABSTRACT

An electroluminescent display device includes a substrate including first, second, and third sub-pixel regions; an interlayer insulating layer and a passivation layer each separately disposed at the first, second, and third sub-pixel regions on the substrate; a reflective electrode disposed on the passivation layer of each of the first, second, and third sub-pixel regions; first, second, and third dielectric layers disposed corresponding to the first, second, and third sub-pixel regions, respectively, on the reflective electrode; a first electrode disposed on each of the first, second, and third dielectric layers; an insulating pattern covering an edge of the first electrode; a light-emitting layer disposed on the first electrode and the insulating pattern and substantially all over the substrate including the first, second, and third sub-pixel regions; and a second electrode disposed on the light-emitting layer, wherein the first, second, and third dielectric layers have different thicknesses.

24 Claims, 11 Drawing Sheets

(52) U.S. Cl.
CPC ............... *G03H 2001/0216* (2013.01); *H01L 2251/5315* (2013.01)

(56) References Cited

U.S. PATENT DOCUMENTS

| | | | |
|---|---|---|---|
| 2014/0295597 A1* | 10/2014 | Sato | H01L 51/5036 438/29 |
| 2019/0026522 A1* | 1/2019 | Wang | G02F 1/29 |
| 2019/0165322 A1* | 5/2019 | Shinya | G09F 9/30 |

* cited by examiner

ELECTROLUMINESCENT DISPLAY DEVICE

CROSS-REFERENCE TO RELATED APPLICATION

This application claims the benefit under 35 U.S.C. § 119(a) of Korean Patent Application No. 10-2017-0173903, filed on Dec. 18, 2017, in the Korean Intellectual Property Office, which is incorporated herein by reference in its entirety.

BACKGROUND

Field of the Disclosure

The present disclosure relates to an electroluminescent display device, and more particularly, to an electroluminescent display device capable of adjusting an optical path while improving optical efficiency and preventing color mixture among sub-pixels.

Description of the Background

In recent years, flat panel displays having excellent characteristics such as being thin, lightweight, and having low power consumption have been widely developed and applied to various fields.

Among the flat panel displays, an electroluminescent display device is a device in which electrical charge carriers are injected into a light-emitting layer formed between a cathode, which is an electron-injecting electrode, and an anode, which is a hole-injecting electrode, such that excitons are formed, and then radiative recombination of the excitons occurs, thereby emitting light.

The electroluminescent display device can be formed using a flexible substrate such as plastic because it is self-luminous, and has excellent contrast ratios. Further the electroluminescent display device has a response time of several micro seconds, and there are advantages in displaying moving images. The electroluminescent display device also has wide viewing angles and is stable under low temperatures. Since the electroluminescent display device is driven by a low voltage of direct current DC 5V to 15V, it is easy to design and manufacture driving circuits.

Recently, as the size of substrates has been increased and display devices have evolved to have a high resolution, a pixel pitch has been decreased, and optical efficiency degradation and color mixture have been problems.

SUMMARY

Accordingly, aspects of the present disclosure are directed to an electroluminescent display device that substantially obviates one or more of the problems due to limitations and disadvantages of the related art.

In addition, the present disclosure is to provide an electroluminescent display device that is capable of improving optical efficiency and adjusting a path of light output to the outside while preventing color mixture.

To achieve the above-described features, the present disclosure provides an electroluminescent display device includes a substrate including first, second, and third sub-pixel regions; an interlayer insulating layer and a passivation layer each separately disposed at the first, second, and third sub-pixel regions on the substrate; a reflective electrode disposed on the passivation layer of each of the first, second, and third sub-pixel regions; first, second, and third dielectric layers disposed corresponding to the first, second, and third sub-pixel regions, respectively, on the reflective electrode; a first electrode disposed on each of the first, second, and third dielectric layers; an insulating pattern covering an edge of the first electrode; a light-emitting layer disposed on the first electrode and the insulating pattern and substantially all over the substrate including the first, second, and third sub-pixel regions; and a second electrode disposed on the light-emitting layer, wherein the first, second, and third dielectric layers have different thicknesses.

In another aspect of the present disclosure, an electroluminescent display device including first, second and third sub-pixel regions includes a reflective electrode disposed at each of the first, second, and third sub-pixel regions; first, second, and third dielectric layers each having a different thickness disposed on the reflective electrode and corresponding to the first, second, and third sub-pixel regions, respectively; a first electrode functioning as an anode and disposed on each of the first, second, and third dielectric layers; an insulating pattern covering an edge of the first electrode; a light-emitting layer disposed on the first electrode and the insulating pattern at the first, second, and third sub-pixel regions; a second electrode functioning as a cathode and disposed on the light-emitting layer; an encapsulation layer disposed on the second electrode; a color filter layer disposed on the encapsulation layer; and an optical path adjusting layer disposed to contact the color filter layer, wherein each of the first, second and third sub-pixel has a different a micro-cavity length defined by a distance between the reflective electrode and the second electrode.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the present disclosure and which are incorporated in and constitute a part of this application, illustrate aspects of the present disclosure and together with the description serve to explain various principles of the present disclosure.

In the drawings.

DETAILED DESCRIPTION

Hereinafter, exemplary aspects of the present disclosure will be described with reference to the accompanying drawings. Wherever possible, the same reference numbers will be used throughout the drawings to refer to the same or like parts.

Figure 1:
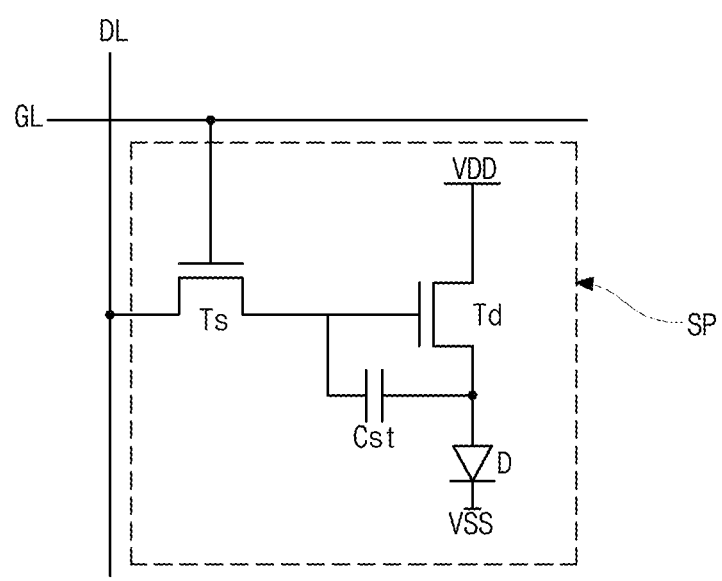
FIG. 1 is a circuit diagram illustrating a single sub-pixel region of an electroluminescent display device according to the present disclosure.

FIG. 1 is a circuit diagram illustrating a single sub-pixel region of an electroluminescent display device according to the present disclosure.

As illustrated in FIG. 1, the electroluminescent display device according to an aspect of the present disclosure includes a gate line GL, a data line DL, a switching thin film transistor Ts, a driving thin film transistor Td, a storage capacitor Cst and a light-emitting diode D. The gate line GL and the data line DL cross each other and define a sub-pixel region SP. The switching thin film transistor Ts, the driving thin film transistor Td, the storage capacitor Cst and the light-emitting diode D are formed in the sub-pixel region SP.

More specifically, a gate electrode of the switching thin film transistor Ts is connected to the gate line GL and a source electrode of the switching film transistor Ts is connected to the data line DL. A gate electrode of the driving thin film transistor Td is connected to a drain electrode of the switching thin film transistor Ts, and a source electrode of the driving thin film transistor Td is connected to a high voltage supply VDD. An anode of the light-emitting diode D is connected to a drain electrode of the driving thin film transistor Td, and a cathode of the light-emitting diode D is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode D is controlled, thereby displaying an image. The light-emitting diode D emits light due to the current supplied through the driving thin film transistor Td from the high voltage supply VDD.

That is, the amount of the current flowing through the light-emitting diode D is proportional to the magnitude of the data signal, and the intensity of light emitted by the light-emitting diode D is proportional to the amount of the current flowing through the light-emitting diode D. Thus, sub-pixel regions SP show different gray levels depending on the magnitude of the data signal, and as a result, the electroluminescent display device displays an image.

The storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode D to be constant and the gray level shown by the light-emitting diode D to be maintained until the next frame.

A transistor and/or a capacitor other than the switching and driving thin film transistors Ts and Td and the storage capacitor Cst may be added into the sub-pixel region SP.

Figure 2:
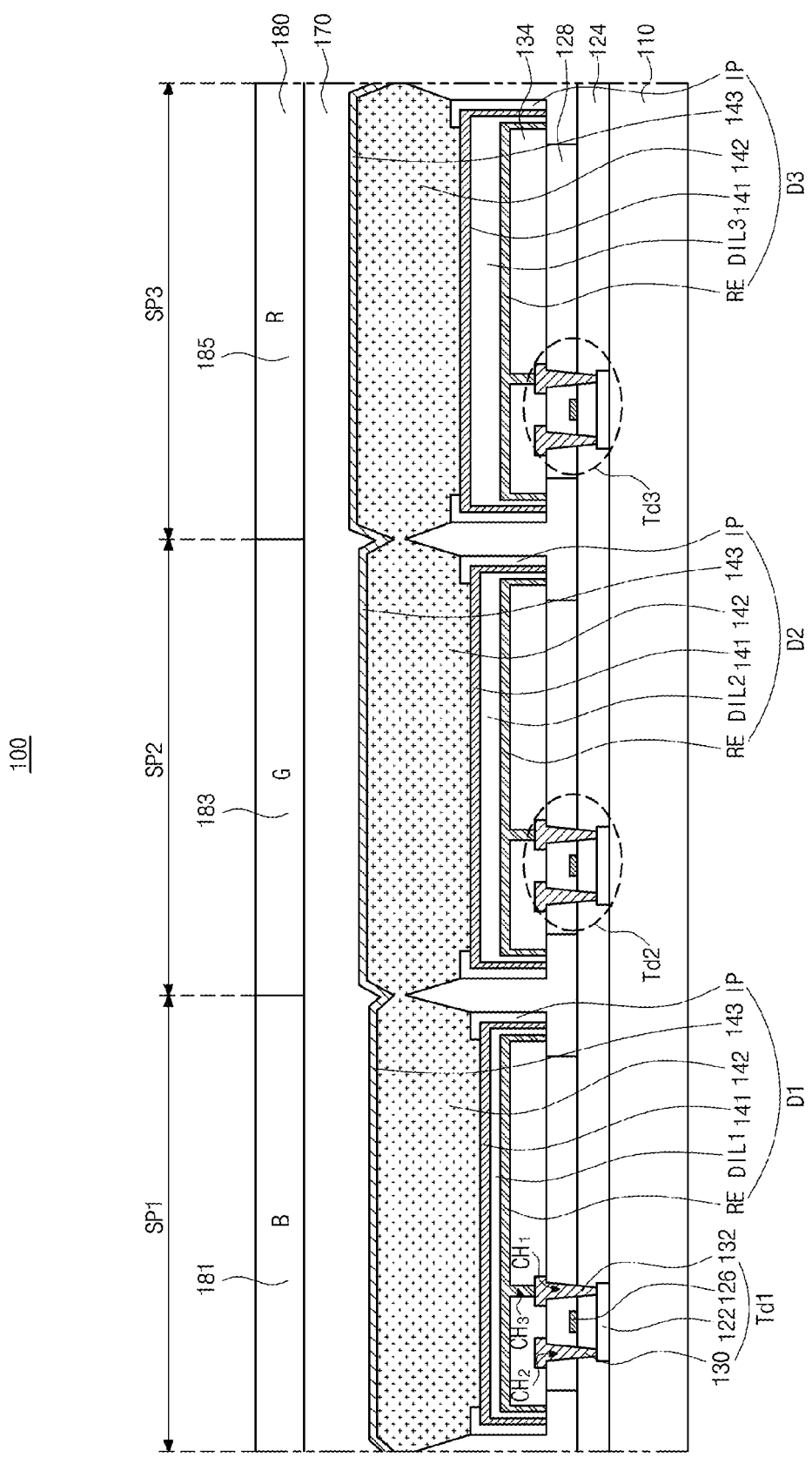
FIG. 2 is a cross-sectional view schematically illustrating an electroluminescent display device according to a first aspect of the present disclosure.

FIG. 2 is a cross-sectional view schematically illustrating an electroluminescent display device according to a first aspect of the present disclosure.

An electroluminescent display device 100 according to the first aspect of the present disclosure may include a substrate 110, thin film transistors Td1, Td2, and Td3 and light emitting diodes D1, D2, and D3 respectively formed in sub-pixel regions SP1, SP2, and SP3 on the substrate 110, an encapsulation layer 170 disposed on the light emitting diodes D1, D2, and D3, and a color filter layer 180 disposed on the encapsulation layer 170.

That is, the thin film transistors Td1, Td2, and Td3 and light emitting diodes D1, D2, and D3 may be respectively formed in the sub-pixel regions SP1, SP2, and SP3 on the substrate 110, which is also referred to as a lower substrate, a thin film transistor (TFT) substrate, or a backplane.

In this case, each of the sub-pixel regions SP1, SP2, and SP3 refers to a unit in which a specific type of color filter patterns 181, 183, and 185 is formed or the light emitting diodes D1, D2, and D3 are able to emit particular colors without the color filter patterns 181, 183, and 185 being formed.

For example, the sub-pixel regions SP1, SP2, and SP3 may include a blue sub-pixel region SP1, a green sub-pixel region SP2, and a red sub-pixel region SP3, but are not limited thereto, and may further include a white sub-pixel region.

A semiconductor layer 122 may be formed in each of the sub-pixel regions SP1, SP2, and SP3. A gate insulating layer 124 may be formed on the semiconductor layer 122 including substantially all over the substrate 110 of the sub-pixel regions SP1, SP2, and SP3. The semiconductor layer 122 may include an active area which is formed of an intrinsic semiconductor material and disposed at the center of the semiconductor layer 122, and a source area and a drain area which are formed of an impurity-doped semiconductor material and respectively disposed at the left and right of the active area.

A gate electrode 126 is formed on the gate insulating layer 124 corresponding to the semiconductor layer 122, and an interlayer insulating layer 128 is formed on the gate electrode 126. The interlayer insulating layer 128 and the gate insulating layer 124 may include first and second contact holes CH1 and CH2 respectively exposing the source area and the drain area of the semiconductor layer 122.

A source electrode 132 and a drain electrode 130 spaced apart from each other are formed on the interlayer insulating layer 128 corresponding to the semiconductor layer 122, and the source electrode 132 and the drain electrode 130 may be connected to the source area and the drain area of the semiconductor layer 122 through the first and second contact holes CH1 and CH2, respectively.

In this case, the semiconductor layer 122, the gate electrode 126, the source electrode 132, and the drain electrode 130 which are formed in each of the sub-pixel regions SP1, SP2, and SP3 may constitute each of the thin film transistors Td1, Td2, and Td3.

Although coplanar type thin film transistors Td1, Td2, and Td3 have been illustrated in FIG. 2 as an example, aspects are not limited thereto, and staggered type thin film transistors may also be formed.

Although only the driving thin film transistors Td1, Td2, and Td3 are illustrated in FIG. 2, a plurality of thin film transistors such as a switching thin film transistor Ts of FIG. 1 having the same structure as the driving thin film transistors Td1, Td2, and Td3 may be formed in a single sub-pixel region.

Although not illustrated, a gate line GL of FIG. 1, a data line DL of FIG. 1 and a power line crossing each other to define the pixel regions SP1, SP2, and SP3 may be formed. The switching thin film transistor Ts of FIG. 1 may be connected to the gate line GL of FIG. 1 and the data line DL of FIG. 1, and each driving thin film transistor Td1, Td2, and Td3 may be connected to the switching thin film transistor Ts of FIG. 1 and the power line.

A passivation layer 134 is formed on each of the thin film transistors Td1, Td2, and Td3. The passivation layer 134 may include a third contact hole CH3 exposing the source electrode 132.

An overcoat layer may be disposed on the passivation layer 134. In this case, the passivation layer 134 and the overcoat layer may include the third contact hole CH3 exposing the source electrode 132.

In this case, holes which separate the sub-pixel regions SP1, SP2, and SP3 may be formed in the passivation layer 134 and the interlayer insulating layer 128. Particularly, the electroluminescent display device 100 according to the first aspect of the present disclosure may have an under-cut form due to a width of a hole of the interlayer insulating layer 128 being formed to be greater than that of a hole of the passivation layer 134. However, aspects are not limited thereto, and the widths of the holes of the passivation layer 134 and the interlayer insulating layer 128 may also be the same.

Due to the holes formed in the passivation layer 134 and the interlayer insulating layer 128, the passivation layer 134 and the interlayer insulating layer 128 may be separately disposed corresponding to the sub-pixel regions SP1, SP2, and SP3.

A reflective electrode RE may be disposed on the passivation layer 134 of each of the sub-pixel regions SP1, SP2, and SP3.

The reflective electrode RE may be formed to cover an upper surface and side surfaces of the passivation layer 134. However, aspects are not limited thereto, and the reflective electrode RE may also be formed to cover only the upper surface of the passivation layer 134.

Here, the reflective electrode RE may serve to reflect light, which is generated in a light-emitting layer 142 and travels toward the substrate 110, upward.

The reflective electrode RE may be formed of aluminum (Al) or silver (Ag).

In this case, although it is difficult to pattern silver for each of the sub-pixel regions SP1, SP2, and SP3 due to etching resistance, since the passivation layer 134 and the interlayer insulating layer 128 separately formed for each of the sub-pixel regions SP1, SP2, and SP3 have the under-cut form in the electroluminescent display device 100 according to the first aspect of the present disclosure, the reflective electrode RE, which is separated for each of the sub-pixel regions SP1, SP2, and SP3, may be formed through a deposition process of silver without a separate patterning process, and a reflectance may be further improved when the reflective electrode RE is formed of silver.

The reflective electrode RE separated for each of the sub-pixel regions SP1, SP2, and SP3 may be connected to the source electrode 132 of each of the thin film transistors Td1, Td2, and Td3 via the third contact hole CH3 formed in the passivation layer 134.

Although the electroluminescent display device 100 according to the first aspect of the present disclosure has been described by assuming that the thin film transistors Td1, Td2, and Td3 are N-type thin film transistors and the reflective electrode RE is connected to the source electrode 132, aspects are not limited thereto. When the thin film transistors Td1, Td2, and Td3 are P-type thin film transistors, the reflective electrode RE may be connected to the drain electrode 130.

First, second, and third dielectric layers DIL1, DIL2, and DIL3 may be disposed on the reflective electrode RE separated for each of the sub-pixel regions SP1, SP2, and SP3.

That is, a first dielectric layer DIL1 may be disposed on the reflective electrode RE corresponding to the blue sub-pixel region SP1, a second dielectric layer DIL2 may be disposed on the reflective electrode RE corresponding to the green sub-pixel region SP2, and a third dielectric layer DIL3 may be disposed on the reflective electrode RE corresponding to the red sub-pixel region SP3.

In this case, thicknesses of the first, second, and third dielectric layers DIL1, DIL2, and DIL3 may be different from one another.

For example, a thickness of the second dielectric layer DIL2 may be formed to be greater than a thickness of the first dielectric layer DIL1, and a thickness of the third dielectric layer DIL3 may be formed to be greater than the thickness of the second dielectric layer DIL2.

Each of the first, second, and third dielectric layers DIL1, DIL2, and DIL3 may cover the upper surface and side surfaces of the reflective electrode RE disposed therebelow. However, aspects are not limited thereto, and each of the first, second, and third dielectric layers DIL1, DIL2, and DIL3 may also cover only the upper surface of the reflective electrode RE disposed therebelow.

A first electrode 141 may be disposed on each of the first, second, and third dielectric layers DIL1, DIL2, and DIL3 which have different heights.

Here, the first electrode 141 may be an anode for supplying holes to the light-emitting layer 142.

The first electrode 141 may be formed of a transparent conductive oxide (TCO) material such as indium tin oxide (ITO) and indium zinc oxide (IZO), but aspects are not limited thereto.

The first electrode 141 may cover an upper surface and side surfaces of each of the first, second, and third dielectric layers DIL1, DIL2, and DIL3. In this case, a contact hole for electrically connecting the first electrode 141 and the reflective electrode RE may be formed in each of the first, second, and third dielectric layers DIL1, DIL2, and DIL3.

Meanwhile, although not illustrated, the first, second, and third dielectric layers DIL1, DIL2, and DIL3 may have a structure in which the first, second, and third dielectric layers DIL1, DIL2, and DIL3 are formed only on the upper surface of the reflective electrode RE disposed therebelow. In this case, the first electrode 141 may be electrically connected to the reflective electrode RE by directly contacting a side surface of the reflective electrode RE. Accordingly, since the contact hole may be omitted from the first, second, and third dielectric layers DIL1, DIL2, and DIL3, an aperture ratio may be improved.

An insulating pattern IP covering an edge of the first electrode 141 may be disposed on the first electrode 141. That is, the insulating pattern IP may be disposed to cover side surfaces and a portion of an upper surface of the first electrode 141.

The insulating pattern IP may be formed of silicon oxide, but aspects are not limited thereto.

In this case, the insulating pattern IP can mitigate a step difference of the first electrode 141 and improve current efficiency. That is, when forming the light-emitting layer 142 on the first electrode 141, the light-emitting layer 142 is formed to have a relatively small thickness on a stepped area of the first electrode 141 so that a current which does not contribute to emission can be prevented from being focused.

The light-emitting layer 142 may be disposed on upper surfaces of the first electrode 141 and the insulating pattern IP which are separated for each of the sub-pixel regions SP1, SP2, and SP3 and have different heights.

In this case, the light-emitting layer 142 may be formed with stepped portions substantially all over the sub-pixel regions SP1, SP2, and SP3.

The light-emitting layer 142 may have a tandem white structure in which a plurality of light-emitting layers are stacked to emit white light. The light-emitting layer 142 may be formed to have a single-stack structure or a multi-stack structure.

The light-emitting layer 142 may be formed of a fluorescent material, a phosphorescent material, a stacked structure of florescent materials, a stacked structure of phosphorescent materials, or a stacked structure of fluorescent materials and phosphorescent materials.

Meanwhile, the light-emitting layer 142 may include a light-emitting layer configured to emit one of blue light, green light, and red light itself. In this case, the color filter layer 180 may be omitted.

The light-emitting layer 142 of the electroluminescent display device 100 according to the first aspect of the present disclosure may include a first groove and a second groove corresponding to a boundary of each of the sub-pixel regions SP1, SP2, and SP3.

The first groove and the second groove will be described in more detail below.

A second electrode 143 supplying electrons to the light-emitting layer 142 may be disposed on the light-emitting layer 142.

In this case, the second electrode 143 may be a cathode.

The second electrode 143 may be formed along the morphology of the light-emitting layer 142. That is, the second electrode 143 may be formed along the stepped portions of the light-emitting layers 142.

Particularly, the second electrode 143 of the electroluminescent display device 100 according to the first aspect of the present disclosure may include a depressed portion corresponding to the first groove of the light-emitting layer 142. That is, the depressed portion may be formed corresponding to the boundary of each of the first, second, and third sub-pixel regions SP1, SP2, and SP3.

The depressed portion of the second electrode 143 will be described in more detail below.

The second electrode 143 may be formed at a higher position in the green sub-pixel region SP2 than in the blue sub-pixel region SP1 and may be formed at a higher position in the red sub-pixel region SP3 than in the green sub-pixel region SP2.

The second electrode 143 may be formed of a TCO material such as ITO and IZO capable of transmitting light, may be formed by forming a semi-transmissive conductive material such as Ag, titanium (Ti), Al, and molybdenum (Mo), or an ally of Ag and magnesium (Mg), which are metallic materials having relatively a very small thickness and a low work function, to have a thickness of several hundred Å or less, or may also be formed of a carbon nanotube, graphene, and the like.

The second electrode 143 may be formed as a dielectric Bragg mirror in which two or more thin films formed of materials having different refractive indices are alternately stacked, may be formed to have a structure in which the dielectric Bragg mirror and a semi-transmissive conductive material are stacked, or may be formed to have a structure in which the dielectric Bragg mirror, a TCO material, and a semi-transmissive conductive material are stacked. When the second electrode 143 is formed to include the dielectric Bragg mirror as described above, color purity may be improved while optical efficiency is further increased.

As described above, the reflective electrode RE, the dielectric layers DIL1, DIL2, and DIL3, the first electrode 141, the insulating pattern IP, the light-emitting layer 142, and the second electrode 143 may overlap each other and form the light emitting diodes D1, D2, and D3, and the light emitting diodes D1, D2, and D3 may be disposed corresponding to the sub-pixel regions SP1, SP2, and SP3, respectively.

In this case, in the electroluminescent display device 100 according to the first aspect of the present disclosure, a distance between the reflective electrode RE and the second electrode 143 may be different for each of the blue, green, and red sub-pixel regions SP1, SP2, and SP3.

For example, the first dielectric layer DIL1 of the blue sub-pixel region SP1 may be formed to have a first thickness, the second dielectric layer DIL2 of the green sub-pixel region SP2 may be formed to have a second thickness which is greater than the first thickness, and the third dielectric layer DIL3 of the red sub-pixel region SP3 may be formed to have a third thickness which is greater than the second thickness.

That is, the distance from the reflective electrode RE to the second electrode 143 in the red sub-pixel region SP3 may be the greatest, the distance from the reflective electrode RE to the second electrode 143 in the blue sub-pixel region SP1 may be the smallest, and the distance from the reflective electrode RE to the second electrode 143 in the green sub-pixel region SP2 may be in the middle.

Consequently, a micro-cavity length of the red sub-pixel region SP3 may be the longest, a micro-cavity length of the blue sub-pixel region SP1 may be the shortest, and a micro-cavity length of the green sub-pixel region SP2 may be in the middle.

Accordingly, since output light may be constructively interfered in each of the sub-pixel regions SP1, SP2, and SP3, luminous efficiency in each of the sub-pixel regions SP1, SP2, and SP3 may be optimized, thereby lowering power consumption.

The encapsulation layer 170 may be disposed on the second electrode 143.

In this case, the encapsulation layer 170 may serve to improve reliability by blocking permeation of moisture or oxygen introduced from the outside.

For this, the encapsulation layer 170 may include at least one inorganic film and at least one organic film.

The inorganic film may be formed of at least one of silicon nitride, aluminum nitride, zirconium nitride, titanium nitride, hafnium nitride, tantalum nitride, silicon nitride, aluminum oxide, or titanium oxide so as to firstly block infiltration of moisture or oxygen from the outside.

The organic film may secondly block the permeation of moisture or oxygen from the outside, serve to mitigate stress between layers due to bending of the electroluminescent display device 100, and reinforce flattening performance.

Such an organic film may be formed of a polymer material such as an acrylic resin, an epoxy-based resin, polyimide or polyethylene.

The encapsulation layer 170 may be formed along the morphology of the second electrode 143.

Meanwhile, the color filter layer 180 may be disposed on the encapsulation layer 170.

In this case, the color filter layer 180 may include the color filter patterns 181, 183, and 185 formed corresponding to the sub-pixel regions SP1, SP2, and SP3, respectively.

Figure 3:
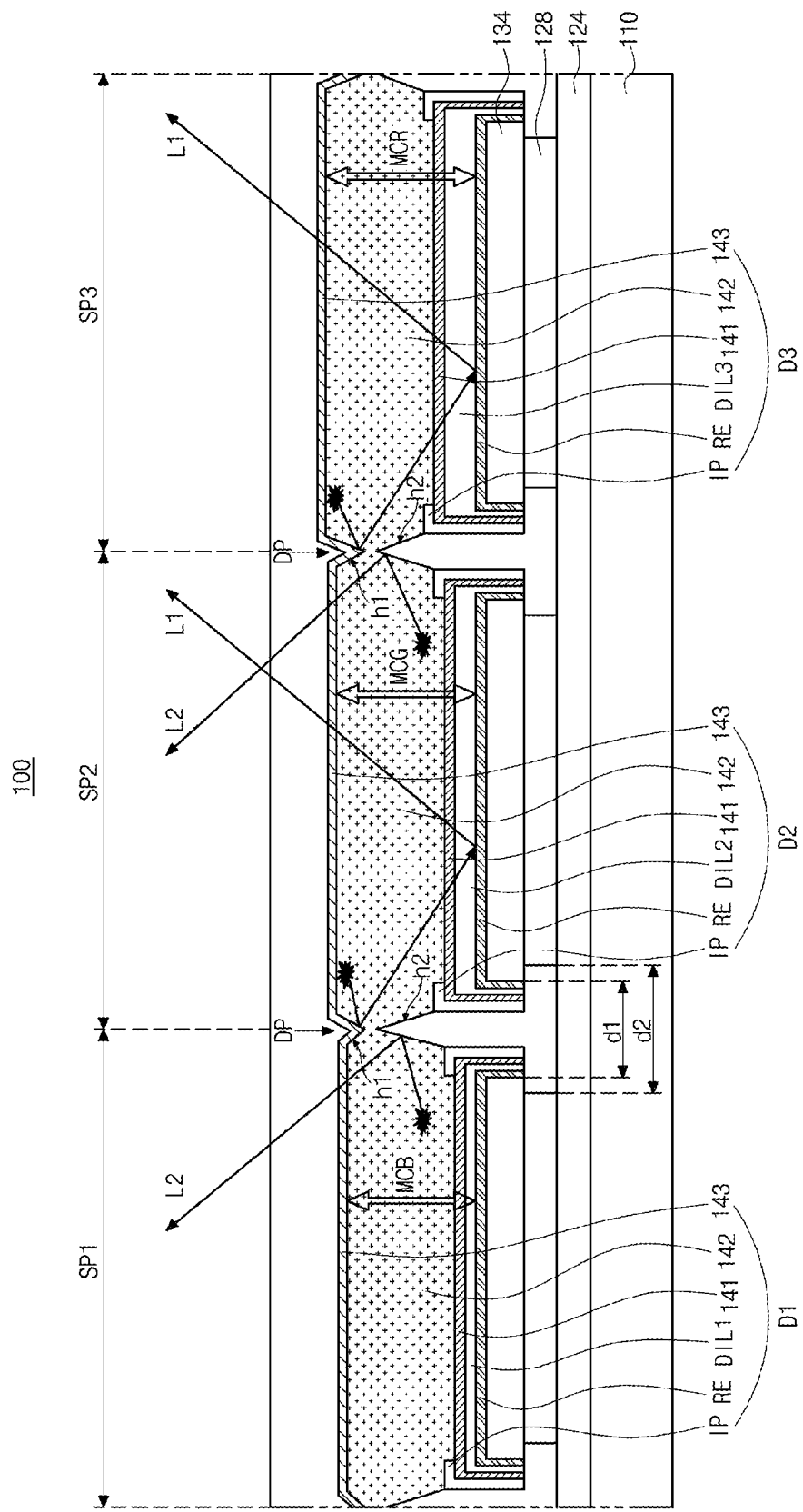
FIG. 3 is an enlarged view of a portion of the electroluminescent display device according to the first aspect of the present disclosure.

FIG. 3 is an enlarged view of a portion of the electroluminescent display device according to the first aspect of the present disclosure.

As illustrated in FIG. 3, the electroluminescent display device 100 of FIG. 2 according to the first aspect of the present disclosure may include a substrate 110 and light emitting diodes D1, D2, and D3 disposed on the substrate 110.

A gate insulating layer 124, an interlayer insulating layer 128, and a passivation layer 134 may be disposed between the substrate 110 and the light emitting diodes D1, D2, and D3.

In this case, holes corresponding to boundaries of sub-pixel regions SP may be formed in the passivation layer 134 and the interlayer insulating layer 128, and accordingly, the passivation layer 134 and the interlayer insulating layer 128 may be separately formed corresponding to sub-pixel regions SP1, SP2, and SP3.

Particularly, the electroluminescent display device 100 of FIG. 2 according to the first aspect of the present disclosure may have an under-cut form due to a width d2 of a hole of the interlayer insulating layer 128 being formed to be greater than width d1 of a hole of the passivation layer 134.

A reflective electrode RE may be disposed on the passivation layer 134 of each of the sub-pixel regions SP1, SP2, and SP3.

The reflective electrode RE may be formed to cover an upper surface and side surfaces of the passivation layer 134. However, aspects are not limited thereto, and the reflective electrode RE may also be formed to cover only the upper surface of the passivation layer 134.

First, second, and third dielectric layers DIL1, DIL2, and DIL3 may be disposed on the reflective electrode RE separated for each of the sub-pixel regions SP1, SP2, and SP3.

In this case, thicknesses of the first, second, and third dielectric layers DIL1, DIL2, and DIL3 may be different from each other.

For example, a thickness of the second dielectric layer DIL2 may be formed to be greater than a thickness of the first dielectric layer DIL1, and a thickness of the third dielectric layer DIL3 may be formed to be greater than the thickness of the second dielectric layer DIL2.

Each of the first, second, and third dielectric layers DIL1, DIL2, and DIL3 may cover the upper surface and side surfaces of the reflective electrode RE disposed therebelow. However, aspects are not limited thereto, and each of the first, second, and third dielectric layers DIL1, DIL2, and DIL3 may also cover only the upper surface of the reflective electrode RE disposed therebelow.

A first electrode 141 may be disposed on each of the first dielectric layer DIL1, the second dielectric layer DIL2, and the third dielectric layer DIL3 which have different heights.

The first electrode 141 may cover an upper surface and side surfaces of each of the first, second, and third dielectric layers DIL1, DIL2, and DIL3. In this case, a contact hole for electrically connecting the first electrode 141 and the reflective electrode RE may be formed in each of the first, second, and third dielectric layers DIL1, DIL2, and DIL3.

Although not illustrated, the first, second, and third dielectric layers DIL1, DIL2, and DIL3 may have a structure in which the first, second, and third dielectric layers DIL1, DIL2, and DIL3 are formed only on the upper surface of the reflective electrode RE disposed therebelow. In this case, the first electrode 141 may be electrically connected to the reflective electrode RE by directly contacting a side surface of the reflective electrode RE. Accordingly, since the contact hole may be omitted from the first, second, and third dielectric layers DIL1, DIL2, and DIL3, an aperture ratio may be improved.

An insulating pattern IP configured to cover an edge of the first electrode 141 may be disposed at the first electrode 141. That is, the insulating pattern IP may be disposed to cover side surfaces and a portion of an upper surface of the first electrode 141.

The insulating pattern IP may be formed of silicon oxide, but aspects are not limited thereto.

In this case, the insulating pattern IP can mitigate a step difference of the first electrode 141 and improve current efficiency. That is, when forming a light-emitting layer 142 on the first electrode 141, the light-emitting layer 142 is formed to have a relatively small thickness on a stepped area of the first electrode 141 so that a current which does not contribute to emission is prevented from being focused.

The light-emitting layer 142 may be disposed at upper surfaces of the first electrode 141 and the insulating pattern IP which are separated for each of the sub-pixel regions SP1, SP2, and SP3 and have different heights.

In this case, the light-emitting layer 142 may be formed with stepped portions substantially all over the sub-pixel regions SP1, SP2, and SP3.

The light-emitting layer 142 may have a tandem white structure in which a plurality of light-emitting layers are stacked to emit white light. The light-emitting layer 142 may be formed to have a single-stack structure or a multi-stack structure.

The light-emitting layer 142 may be formed of a fluorescent material, a phosphorescent material, a stacked structure of florescent materials, a stacked structure of phosphorescent materials, or a stacked structure of fluorescent materials and phosphorescent materials.

Meanwhile, the light-emitting layer 142 may be formed of a light-emitting layer configured to emit one of blue light, green light, and red light itself. In this case, the color filter layer 180 may be omitted.

Particularly, the light-emitting layer 142 of the electroluminescent display device 100 according to the first aspect of the present disclosure may include a first groove h1 and a second groove h2 formed corresponding to a boundary of each of the sub-pixel regions SP1, SP2, and SP3.

That is, the first groove h1 may be formed corresponding to the boundary of each of the sub-pixel regions SP1, SP2, and SP3 at an upper surface of the light-emitting layer 142.

In this case, the first groove h1 may have a width that progressively narrows toward a lower portion at which the substrate 110 is disposed.

The second groove h2 may be formed corresponding to the boundary of each of the sub-pixel regions SP1, SP2, and SP3 at a lower surface of the light-emitting layer 142.

Here, the second groove h2 may have a width that progressively narrows toward an upper portion at which a second electrode 143 is disposed.

Accordingly, the light-emitting layer 142 may have a thickness that progressively decreases corresponding to the boundaries of the sub-pixel regions SP1, SP2, and SP3 due to the first groove h1 and the second groove h2.

In this case, when the light-emitting layer 142 has a tandem white structure in which a plurality of light-emitting layers are stacked to emit white light, a carrier generation layer (CGL) may be disconnected at the boundaries of the sub-pixel regions SP1, SP2, and SP3 due to the second groove h2. Accordingly, a flow of a leakage current to adjacent sub-pixel regions SP1, SP2, and SP3 may be blocked due to the carrier generation layer so that degradation in image quality due to unintentional driving of the adjacent sub-pixel regions SP1, SP2, and SP3 is prevented.

The second electrode 143 for supplying electrons to the light-emitting layer 142 may be disposed on the light-emitting layer 142.

The second electrode 143 may be formed along the morphology of the light-emitting layer 142 including the first groove h1.

Accordingly, the second electrode 143 of the electroluminescent display device 100 of FIG. 2 according to the first aspect of the present disclosure may include a depressed portion DP formed corresponding to the first groove h1 of the light-emitting layer 142. That is, the depressed portion DP may be formed corresponding to the boundary of each of the sub-pixel regions SP1, SP2, and SP3.

The depressed portion DP of the second electrode 143 may have a width that progressively narrows toward the lower portion, at which the substrate 110 is disposed, corresponding to the boundary of each of the sub-pixel regions SP1, SP2, and SP3.

The second electrode 143 may be formed at a higher position in the green sub-pixel region SP2 than in the blue sub-pixel region SP1 and may be formed at a higher position in the red sub-pixel region SP3 than in the green sub-pixel region SP2.

As described above, the reflective electrode RE, the dielectric layers DIL1, DIL2, and DIL3, the first electrode 141, the insulating pattern IP, the light-emitting layer 142, and the second electrode 143 may overlap each other and form the light emitting diodes D1, D2, and D3, and the light emitting diodes D1, D2, and D3 may be disposed corresponding to the sub-pixel regions SP1, SP2, and SP3, respectively.

In this case, in the electroluminescent display device 100 according to the first aspect of the present disclosure, a distance between the reflective electrode RE and the second electrode 143 may be different for each of the blue, green, and red sub-pixel regions SP1, SP2, and SP3.

That is, a micro-cavity length of the red sub-pixel region SP3 may be the longest, a micro-cavity length of the blue sub-pixel region SP1 may be the shortest, and a micro-cavity length of the green sub-pixel region SP2 may be in the middle.

Accordingly, since output light may be constructively interfered in each of the sub-pixel regions SP1, SP2, and SP3, luminous efficiency in each of the sub-pixel regions SP1, SP2, and SP3 may be optimized, thereby lowering power consumption.

An encapsulation layer 170 may be disposed on the second electrode 143.

The encapsulation layer 170 may be formed along the morphology of the second electrode 143.

Accordingly, the electroluminescent display device 100 of FIG. 2 according to the first aspect of the present disclosure may have a structure that satisfies the micro-cavity conditions so that particular colored light is amplified when repeated reflection occurs in spaces of the light emitting diodes D1, D2, and D3 such as when light generated in the light-emitting layer 142 is reflected by the reflective electrode RE and the light re-reflected by the second electrode 143 is reflected yet again by the reflective electrode RE.

For example, in the light emitting diode D1 of the blue sub-pixel region SP1 in which a blue color filter pattern 181 of FIG. 2 is disposed, a distance between the reflective electrode RE and the second electrode 143 may be a blue light path distance MCB so that the blue micro-cavity condition is satisfied.

Meanwhile, in the light emitting diode D2 of the green sub-pixel region SP2 in which a green color filter pattern 183 of FIG. 2 is disposed, a distance between the reflective electrode RE and the second electrode 143 may be a green light path distance MCG so that the green micro-cavity condition is satisfied.

Also, in the light emitting diode D3 of the red sub-pixel region SP3 in which a red color filter pattern 185 of FIG. 2 is disposed, a distance between the reflective electrode RE and the second electrode 143 may be a red light path distance MCR so that the red micro-cavity condition is satisfied.

Since the sub-pixel regions SP1, SP2, and SP3 have different optical path distances MCB, MCG, and MCR as described above, only a wavelength of particular colored light is amplified and wavelengths of the other colored lights are cancelled or attenuated due to the micro-cavity effect in spaces according to the optical path distances MCB, MCG, and MCR in the sub-pixel regions SP1, SP2, and SP3.

For example, in the blue sub-pixel region SP1 in which the blue color filter pattern 181 of FIG. 2 is disposed, from among lights generated in the light-emitting layer 142, only a wavelength of blue light is amplified and wavelengths of the other colored lights are cancelled or attenuated.

As a result, the amplified blue light is filtered by the blue color filter pattern 181 of FIG. 2 and output upward while the other colored lights are unable to pass through the blue color filter pattern 181 of FIG. 2.

In the green sub-pixel region SP2 in which the green color filter pattern 183 of FIG. 2 is disposed, from among lights generated in the light-emitting layer 142, only a wavelength of green light is amplified and wavelengths of the other colored lights are cancelled or attenuated.

As a result, the amplified green light is filtered by the green color filter pattern 183 of FIG. 2 and output upward while the other colored lights are unable to pass through the green color filter pattern 183 of FIG. 2.

In the red sub-pixel region SP3 in which the red color filter pattern 185 of FIG. 2 is disposed, from among lights generated in the light-emitting layer 142, only a wavelength of red light is amplified and wavelengths of the other colored lights are cancelled or attenuated.

As a result, the amplified red light is filtered by the red color filter pattern 185 of FIG. 2 and output upward while the other colored lights are unable to pass through the red color filter pattern 185 of FIG. 2.

Particularly, in the electroluminescent display device 100 of FIG. 2 according to the first aspect of the present disclosure, the light-emitting layer 142 includes the first groove h1 and the second groove h2 corresponding to the boundary of each of the sub-pixel regions SP1, SP2, and SP3, and due to the first groove h1, the second electrode 143 includes the depressed portion DP which is formed along the morphology of the first groove h1.

Accordingly, light L1 that travels to adjacent sub-pixel regions SP1, SP2, and SP3 from among lights output from the light-emitting layer 142 is reflected by the depressed portion DP of the second electrode 143, re-reflected by the reflective electrode RE, and output to upper portions of the corresponding sub-pixel regions SP1, SP2, and SP3. Therefore, optical efficiency may be improved while color mixture is prevented.

The second groove h2 of the light-emitting layer 142 may be formed with an air gap. Due to the air gap formed in the second groove h2 of the light-emitting layer 142, light L2 that travels to adjacent sub-pixel regions SP1, SP2, and SP3 from among lights output from the light-emitting layer 142 is reflected by the air gap, re-reflected by the reflective electrode RE, and output to the upper portions of the corresponding sub-pixel regions SP1, SP2, and SP3. Therefore, optical efficiency may be further improved while color mixture is prevented.

Further, when the light-emitting layer 142 has the tandem white structure in which a plurality of light-emitting layers are stacked to emit white light, a carrier generation layer may be disconnected at the boundaries of the sub-pixel regions SP1, SP2, and SP3 due to the second groove h2. Accordingly, a flow of a leakage current to adjacent sub-pixels may be blocked due to the carrier generation layer so that degradation in image quality due to unintentional driving of the adjacent sub-pixels is prevented.

In recent years, an electroluminescent display device having a structure in which a black matrix between a plurality of color filter patterns is omitted has been proposed for definition enhancement of patterns for implementing a high-definition display, and a head mount display (HMD) that allows viewing of images output from two electroluminescent display devices provided corresponding to left and right eyes through an optical system such as a mirror has been developed.

However, there are problems in that color mixture occurs when the definition of the patterns is extremely enhanced and that it is difficult to reduce the size and weight of the optical system in the head mount display.

Hereinafter, an electroluminescent display device capable of realizing size reduction and weight reduction of an optical system in a head mount display while preventing color mixture even when definition of patterns is extremely enhanced will be described according to a second aspect.

Hereinafter, detailed description of configurations identical or similar to those of the first aspect may be omitted.

Figure 4:
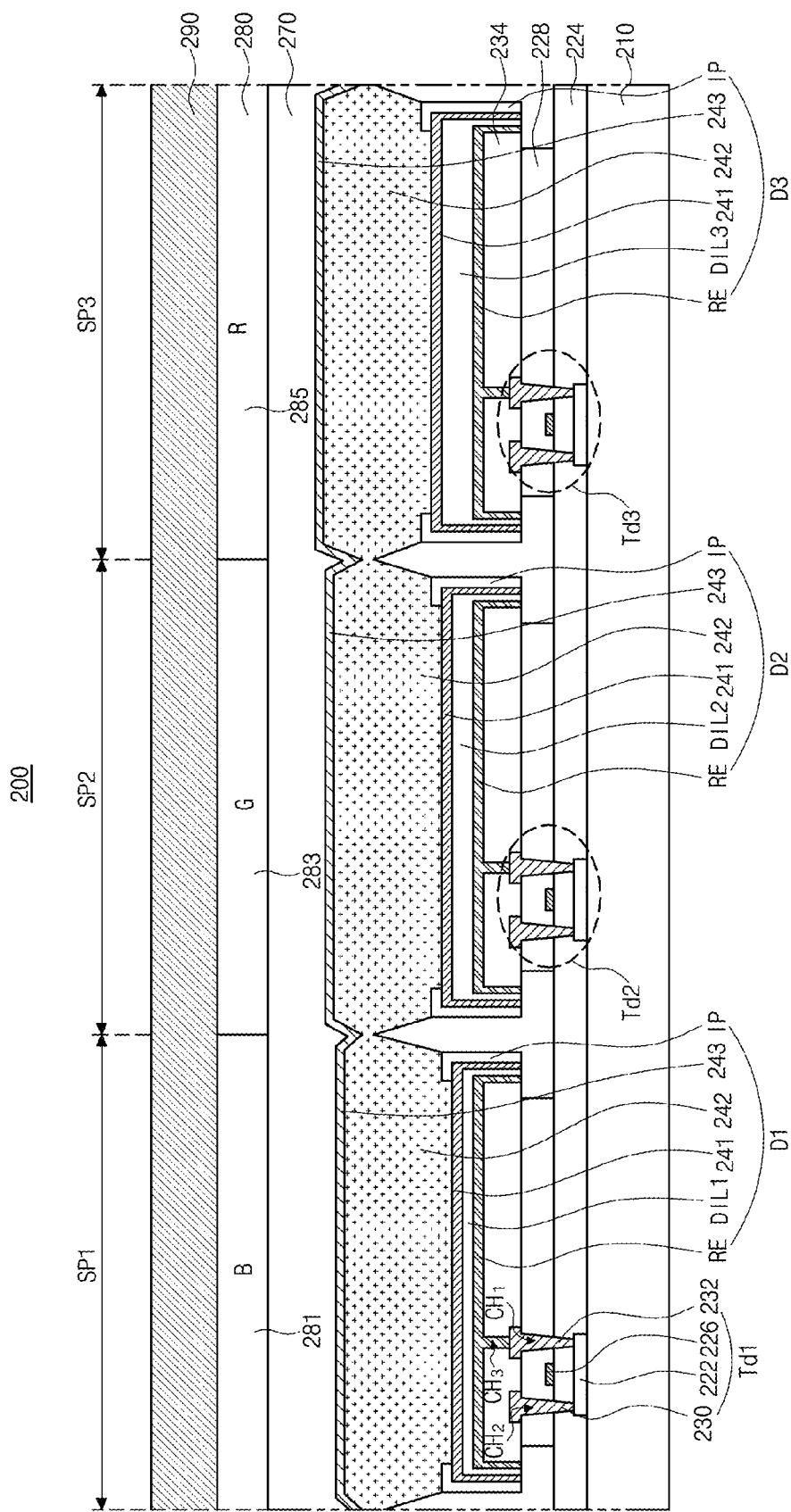
FIG. 4 is a cross-sectional view schematically illustrating an electroluminescent display device according to a second aspect of the present disclosure.

FIG. 4 is a cross-sectional view schematically illustrating an electroluminescent display device according to a second aspect of the present disclosure.

An electroluminescent display device 200 according to the second aspect of the present disclosure may include a substrate 210, thin film transistors Td1, Td2, and Td3 and light emitting diodes D1, D2, and D3 respectively formed in sub-pixel regions SP1, SP2, and SP3 on the substrate 210, an encapsulation layer 270 disposed on the light emitting diodes D1, D2, and D3, and a color filter layer 280 disposed on the encapsulation layer 270.

Particularly, in the second aspect of the present disclosure, an optical path adjusting layer 290 may be disposed on the color filter layer 280.

That is, the thin film transistors Td1, Td2, and Td3 and light emitting diodes D1, D2, and D3 may be respectively formed in the sub-pixel regions SP1, SP2, and SP3 on the substrate 210, which is also referred to as a lower substrate, a thin film transistor substrate, or a backplane.

In this case, each of the sub-pixel regions SP1, SP2, and SP3 refers to a unit in which a specific type of color filter patterns 281, 283, and 285 is formed or the light emitting diodes D1, D2, and D3 are able to emit particular colors without the color filter patterns 281, 283, and 285 being formed.

For example, the sub-pixel regions SP1, SP2, and SP3 may include a blue sub-pixel region SP1, a green sub-pixel region SP2, and a red sub-pixel region SP3, but are not limited thereto, and may further include a white sub-pixel region.

A semiconductor layer 222 may be formed in each of the sub-pixel regions SP1, SP2, and SP3. A gate insulating layer 224 may be formed on the semiconductor layer 222 substantially all over the substrate 210 including the sub-pixel regions SP1, SP2, and SP3. The semiconductor layer 222 may include an active area which is formed of an intrinsic semiconductor material and disposed at the center of the semiconductor layer 222, and a source area and a drain area which are formed of an impurity-doped semiconductor material and respectively disposed at the left and right of the active area.

A gate electrode 226 is formed on the gate insulating layer 224 corresponding to the semiconductor layer 222, and an interlayer insulating layer 228 is formed on the gate electrode 226. The interlayer insulating layer 228 and the gate insulating layer 224 may include first and second contact holes CH1 and CH2 respectively exposing the source area and the drain area of the semiconductor layer 222.

A source electrode 232 and a drain electrode 230 spaced apart from each other are formed on the interlayer insulating layer 228 corresponding to the semiconductor layer 222, and the source electrode 232 and the drain electrode 230 may be connected to the source area and the drain area of the semiconductor layer 222 through the first and second contact holes CH1 and CH2, respectively.

In this case, the semiconductor layer 222, the gate electrode 226, the source electrode 232, and the drain electrode 230 which are formed in each of the sub-pixel regions SP1, SP2, and SP3 may constitute each of the thin film transistors Td1, Td2, and Td3.

Although coplanar type thin film transistors Td1, Td2, and Td3 have been illustrated in FIG. 4 as an example, aspects are not limited thereto, and staggered type thin film transistors may also be formed.

A passivation layer 234 is formed on each of the thin film transistors Td1, Td2, and Td3. The passivation layer 234 may include a third contact hole CH3 exposing the source electrode 232.

In this case, holes which separate the sub-pixel regions SP1, SP2, and SP3 may be formed in the passivation layer 234 and the interlayer insulating layer 228. Particularly, the electroluminescent display device 200 according to the second aspect of the present disclosure may have an undercut form due to a width of a hole of the interlayer insulating layer 228 being formed to be greater than that of a hole of the passivation layer 234. However, aspects are not limited thereto, and the widths of the holes of the passivation layer 234 and the interlayer insulating layer 228 may also be the same.

Due to the holes formed in the passivation layer 234 and the interlayer insulating layer 228, the passivation layer 234 and the interlayer insulating layer 228 may be separately disposed corresponding to the sub-pixel regions SP1, SP2, and SP3.

A reflective electrode RE may be disposed on the passivation layer 234 of each of the sub-pixel regions SP1, SP2, and SP3.

First, second, and third dielectric layers DIL1, DIL2, and DIL3 may be disposed on the reflective electrode RE separated for each of the sub-pixel regions SP1, SP2, and SP3.

A first electrode 241 may be disposed on each of the first dielectric layer DIL1, the second dielectric layer DIL2, and the third dielectric layer DIL3 which have different heights.

An insulating pattern IP covering an edge of the first electrode 241 may be disposed on the first electrode 241. That is, the insulating pattern IP may be disposed to cover side surfaces and a portion of an upper surface of the first electrode 241.

A light-emitting layer 242 may be disposed on upper surfaces of the first electrode 241 and the insulating pattern IP which are separated for each of the sub-pixel regions SP1, SP2, and SP3 and have different heights.

The light-emitting layer 242 of the electroluminescent display device 200 according to the second aspect of the present disclosure may include a first groove and a second groove corresponding to a boundary of each of the sub-pixel regions SP1, SP2, and SP3.

A second electrode 243 for supplying electrons to the light-emitting layer 242 may be disposed on the light-emitting layer 242.

Particularly, the second electrode 243 of the electroluminescent display device 200 according to the second aspect of the present disclosure may include a depressed portion corresponding to the first groove of the light-emitting layer 242. That is, the depressed portion may be formed corresponding to the boundary of each of the sub-pixel regions SP1, SP2, and SP3.

As described above, the reflective electrode RE, the dielectric layers DIL1, DIL2, and DIL3, the first electrode 241, the insulating pattern IP, the light-emitting layer 242, and the second electrode 243 may overlap each other and form the light emitting diodes D1, D2, and D3, and the light emitting diodes D1, D2, and D3 may be disposed corresponding to the sub-pixel regions SP1, SP2, and SP3, respectively.

A micro-cavity length of the red sub-pixel region SP3 may be the longest, a micro-cavity length of the blue sub-pixel region SP1 may be the shortest, and a micro-cavity length of the green sub-pixel region SP2 may be in the middle.

Accordingly, since output light may be constructively interfered in each of the sub-pixel regions SP1, SP2, and SP3, luminous efficiency in each of the sub-pixel regions SP1, SP2, and SP3 may be optimized, thereby lowering power consumption.

The encapsulation layer 270 may be disposed on the second electrode 243.

The color filter layer 280 may be disposed on the encapsulation layer 270.

In this case, the color filter layer 280 may include the color filter patterns 281, 283, and 285 formed corresponding to the sub-pixel regions SP1, SP2, and SP3.

Particularly, the optical path adjusting layer 290 may be disposed on the color filter layer 280 of the electroluminescent display device 200 of FIG. 4 according to the second aspect of the present disclosure.

In this case, the optical path adjusting layer 290 may adjust paths of lights output from the light emitting diodes D1, D2, and D3.

For example, lights output from the light emitting diodes D1, D2, and D3 may be focused to an area in which an optical system is disposed so that the size and weight of the optical system are reduced, and a path of light traveling to adjacent sub-pixel regions SP1, SP2, and SP3 from among lights output from the light emitting diodes D1, D2, and D3 may be adjusted so that color mixture is prevented.

In this case, the optical path adjusting layer 290 may be formed using any one of a Fresnel lens, a liquid crystal lens, a holographic optical element (HOE), and a diffractive optical element (DOE), but aspects are not limited thereto.

That is, a path of light output to the outside via the color filter layer 280 may be adjusted using a Fresnel lens disposed on the color filter layer 280.

Here, the Fresnel lens may be configured using both a glass type Fresnel lens and a film type Fresnel lens.

The Fresnel lens is briefly described as follows. A Fresnel lens refers to a lens that has the same function as a convex lens but has a reduced thickness. Even if the thickness is reduced, the Fresnel lens can function as a convex lens because the Fresnel lens is divided into several bands, and each band functions as a prism such that aberration is reduced. That is, the Fresnel lens is a type of condenser, which is not a lens used for image formation but a lens used for focusing light in a desired direction and place. Therefore, a path of light may be adjusted using the Fresnel lens.

Using the liquid crystal lens, a liquid crystal layer may be driven by applying different voltages to the liquid crystal layer depending on positions of an electrode so that a phase of incident light, which is incident on the liquid crystal layer, is changed depending on positions of the incident light so as to adjust a path of output light.

A path of light may also be adjusted using diffractive optical elements.

For example, a path of light output to the outside via the color filter layer 280 may be adjusted using a holographic optical element by diffracting the light through the holographic optical element disposed on the color filter layer 280.

The above-described Fresnel lens, liquid crystal lens, holographic optical element, and diffractive optical element which constitute the optical path adjusting layer 290 are merely examples, and aspects are not limited thereto.

Figure 5A:
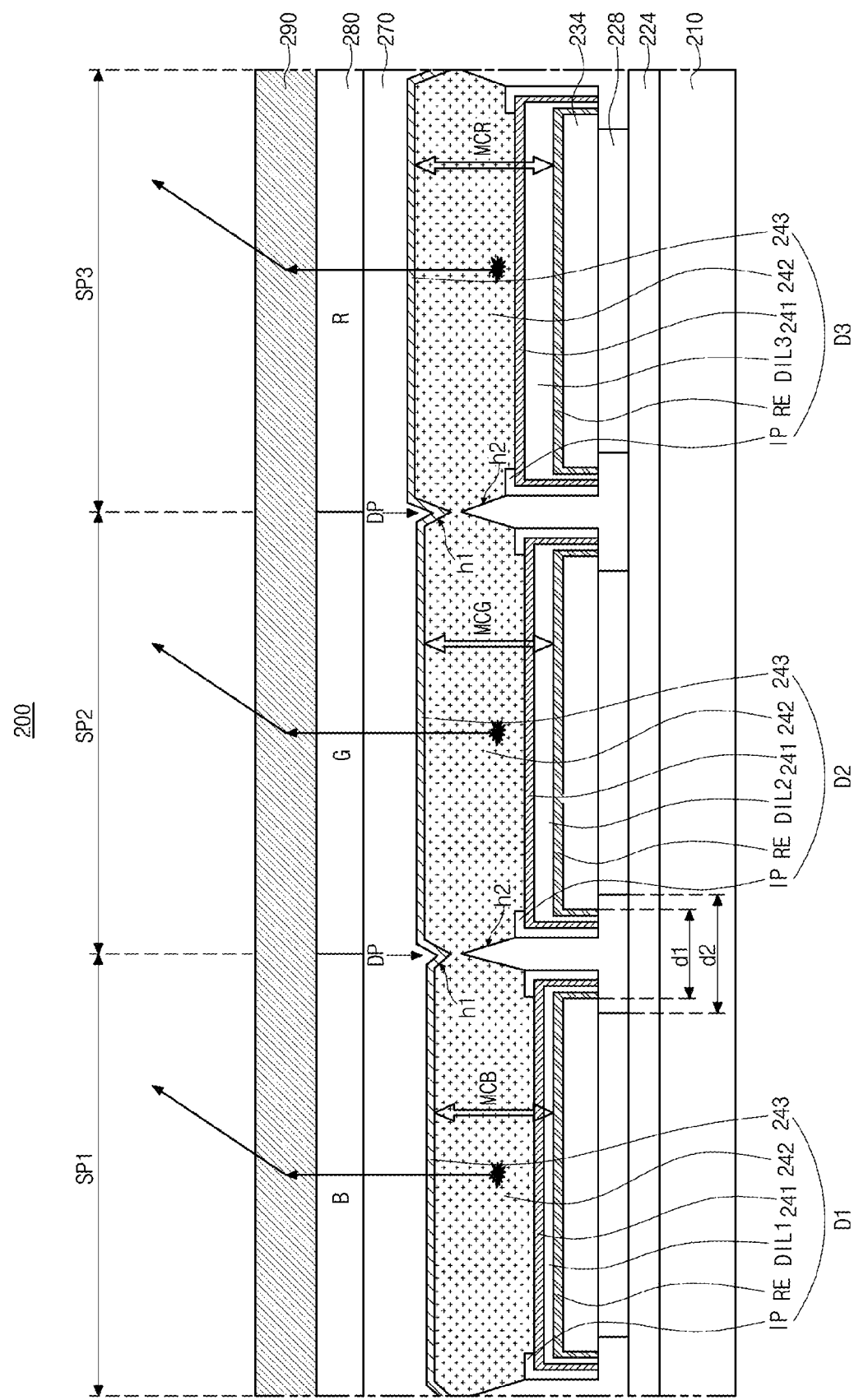
FIGS. 5A to 5C are views schematically illustrating a path of light of the electroluminescent display device according to the second aspect of the present disclosure.
Figure 5B:
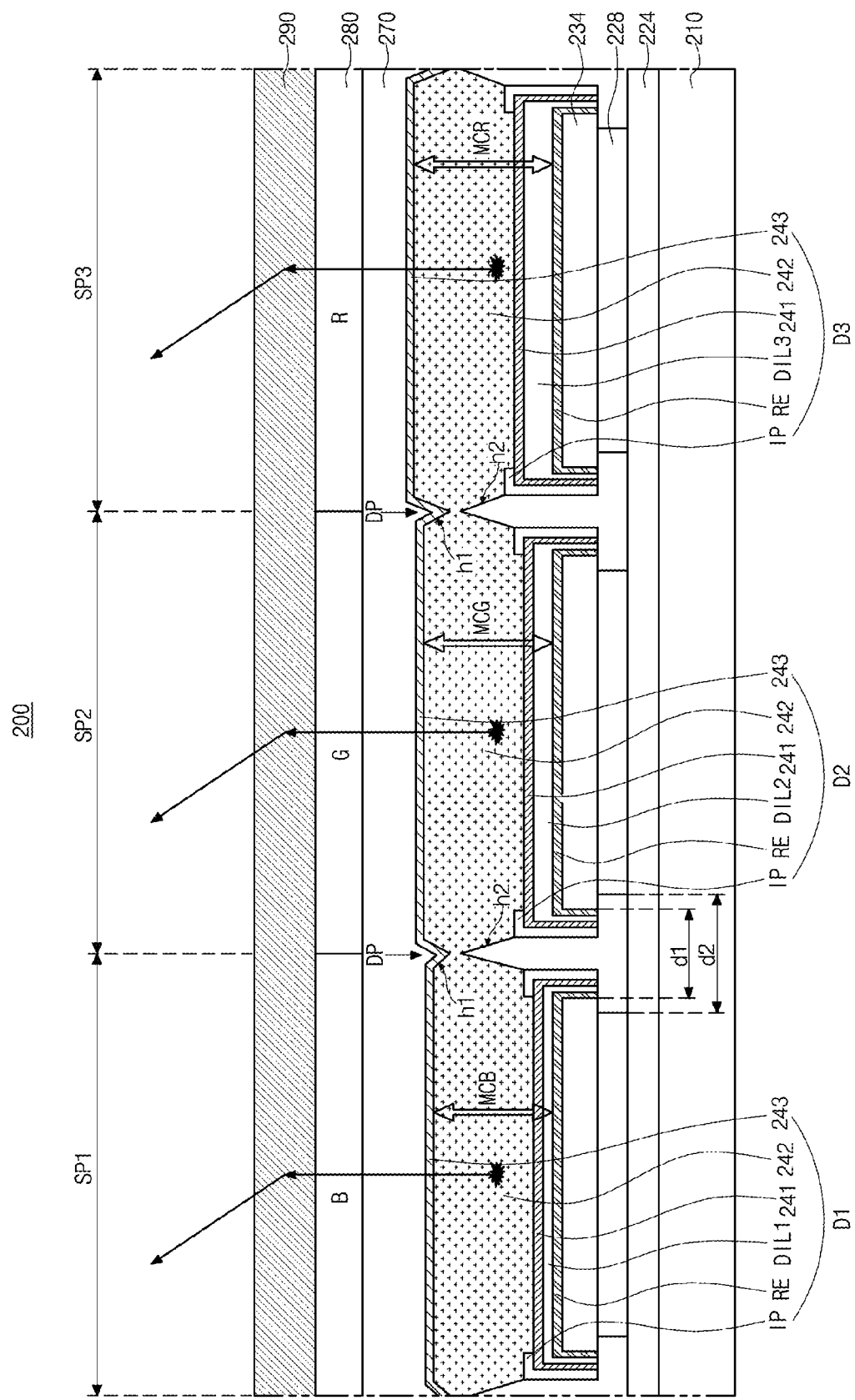
Figure 5C:
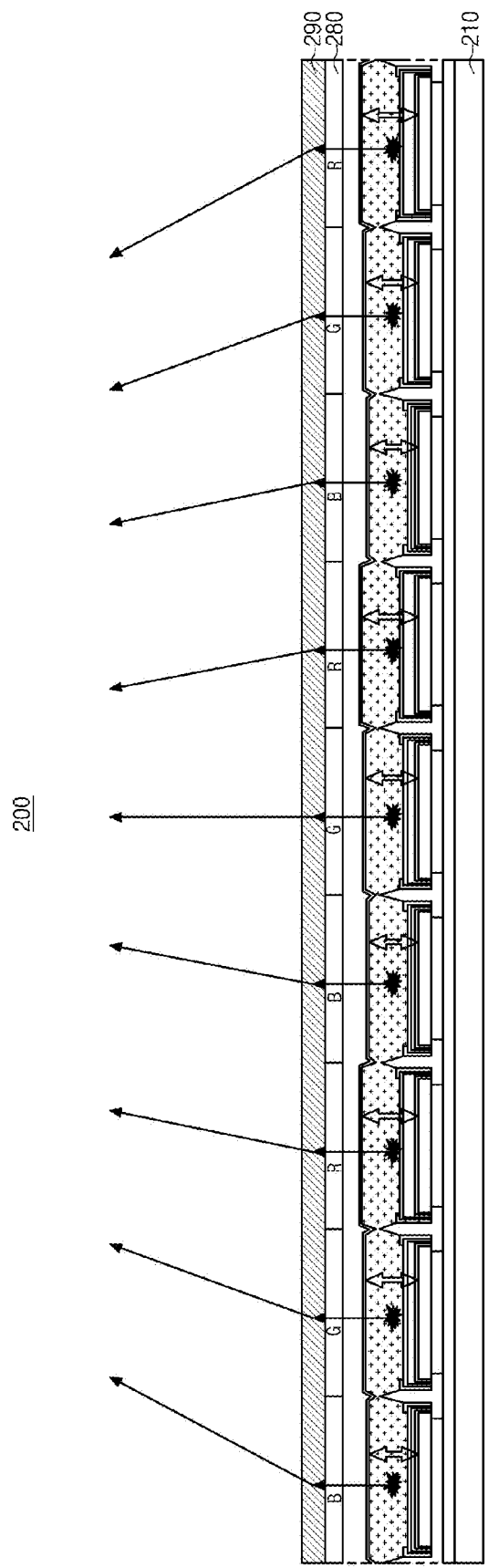

FIGS. 5A to 5C are views schematically illustrating a path of light of the electroluminescent display device according to the second aspect of the present disclosure.

As illustrated in FIGS. 5A to 5C, an electroluminescent display device 200 according to the second aspect of the present disclosure may include a substrate 210, light emitting diodes D1, D2, and D3 disposed on the substrate 210, a color filter layer 280 disposed on the light emitting diodes D1, D2, and D3, and an optical path adjusting layer 290 disposed on the color filter layer 280.

A light-emitting layer 242 of FIG. 4 in each of the light emitting diodes D1, D2, and D3 may include a first groove h1 and a second groove h2 formed corresponding to a boundary of each of sub-pixel regions SP1, SP2, and SP3.

That is, the first groove h1 may be formed corresponding to the boundary of each of the sub-pixel regions SP1, SP2, and SP3 at an upper surface of the light-emitting layer 242 of FIG. 4.

In this case, the first groove h1 may have a width that progressively narrows toward a lower portion at which the substrate 210 is disposed.

The second groove h2 may be formed corresponding to the boundary of each of the sub-pixel regions SP1, SP2, and SP3 at a lower surface of the light-emitting layer 242 of FIG. 4.

In this case, the second groove h2 may have a width that progressively narrows toward an upper portion at which a second electrode 243 of FIG. 4 is disposed.

Accordingly, the light-emitting layer 242 of FIG. 4 may have a thickness that progressively decreases corresponding to the boundaries of the sub-pixel regions SP1, SP2, and SP3 due to the first groove h1 and the second groove h2.

The second electrode 243 of FIG. 4 may have a depressed portion DP formed corresponding to the boundary of each of the sub-pixel regions SP1, SP2, and SP3 along the morphology of the light-emitting layer 242 of FIG. 4 including the first groove h1.

In the electroluminescent display device 200 according to the second aspect, a micro-cavity length of the red sub-pixel region SP3 may be the longest, a micro-cavity length of the blue sub-pixel region SP1 may be the shortest, and a micro-cavity length of the green sub-pixel region SP2 may be in the middle.

Accordingly, since output light may be constructively interfered in each of the sub-pixel regions SP1, SP2, and SP3, luminous efficiency in each of the sub-pixel regions SP1, SP2, and SP3 may be optimized, thereby lowering power consumption.

That is, since the sub-pixel regions SP1, SP2, and SP3 have different optical path distances MCB, MCG, and MCR, only a wavelength of particular colored light is amplified and wavelengths of the other colored lights are cancelled or attenuated due to the micro-cavity effect in spaces according to the optical path distances MCB, MCG, and MCR in the sub-pixel regions SP1, SP2, and SP3.

Light that travels to adjacent sub-pixel regions SP1, SP2, and SP3 from among lights output from the light-emitting layer 242 of FIG. 4 is reflected due to the shape of the depressed portion DP of the second electrode 243 of FIG. 4 and the air gap formed in the second groove h2 of the light-emitting layer 242 so that optical efficiency is improved while color mixture is prevented.

Particularly, since the optical path adjusting layer 290 is disposed on the color filter layer 280 in the electroluminescent display device 200 according to the second aspect of the present disclosure, a path of light incident on the optical path adjusting layer 290 via the color filter layer 280 may be adjusted in a predetermined direction as illustrated in FIGS. 5A and 5B.

Accordingly, light output from the electroluminescent display device 200 may also be condensed to a central area as illustrated in FIG. 5C.

Accordingly, by focusing light output from the electroluminescent display device 200 to an area in which an optical system is disposed, the size and weight of an optical system of a head mount display with which images may be viewed through the optical system may be reduced.

Figure 6A:
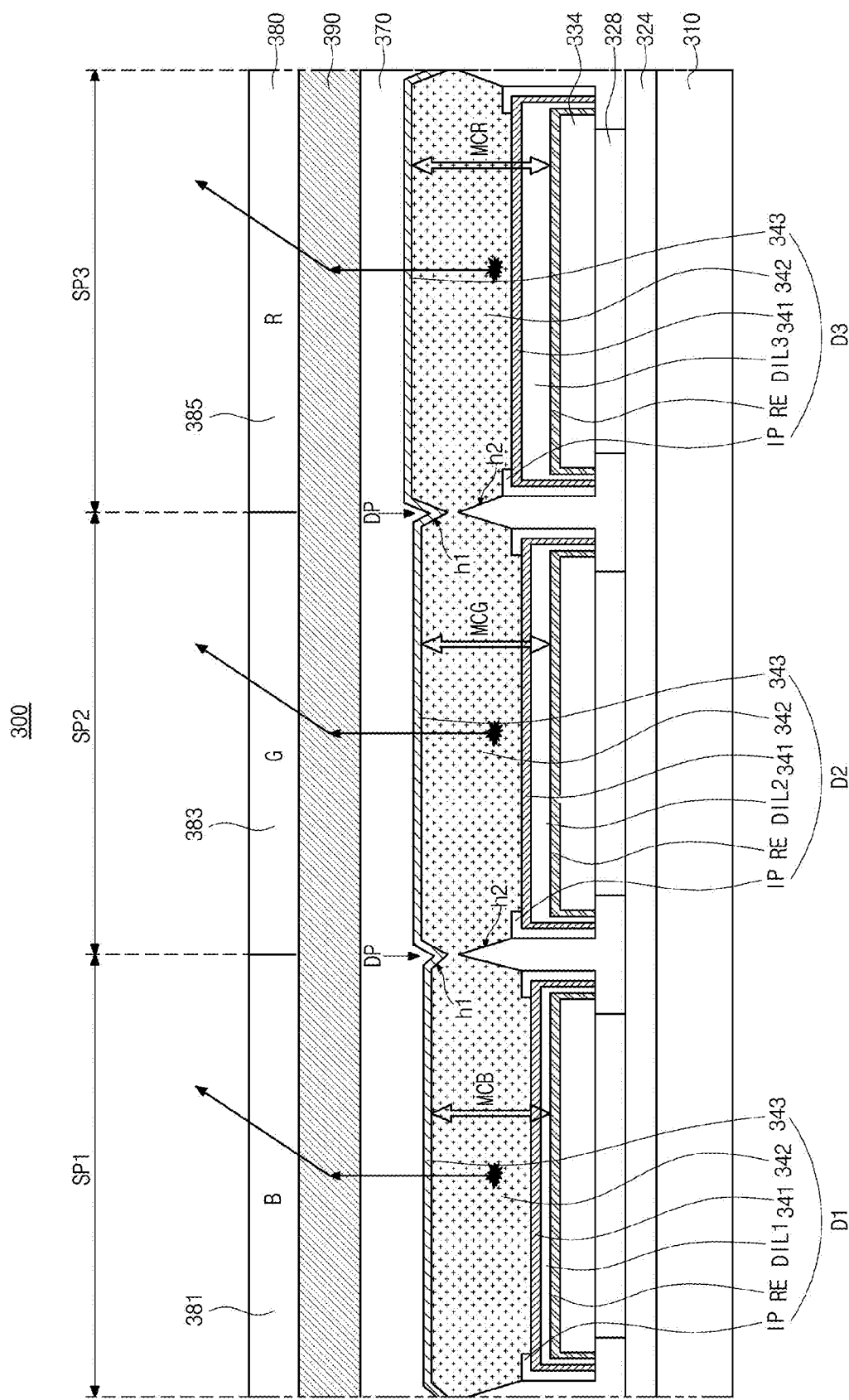
FIGS. 6A to 6C are cross-sectional views schematically illustrating an electroluminescent display device according to a third aspect of the present disclosure.
Figure 6B:
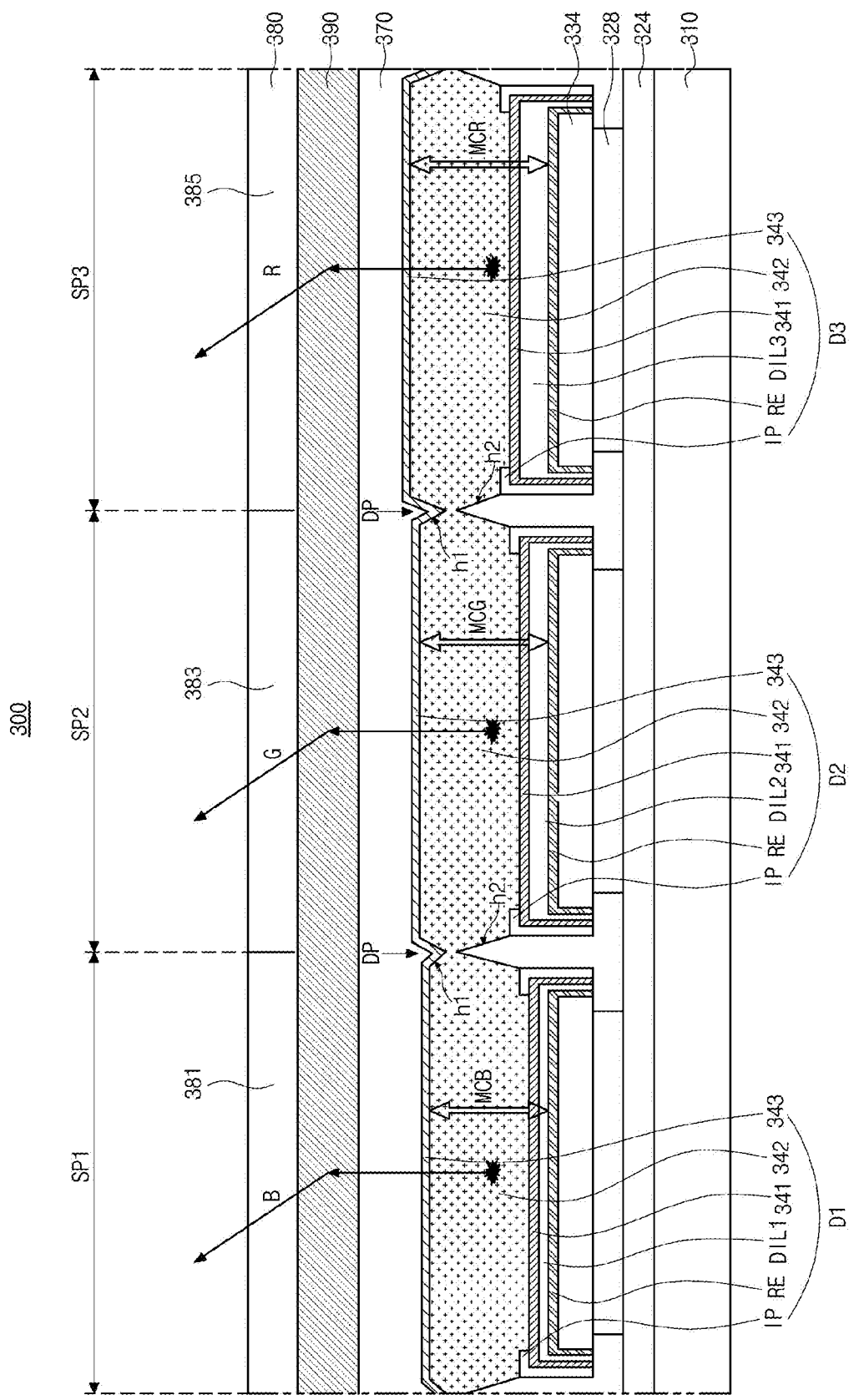
Figure 6C:
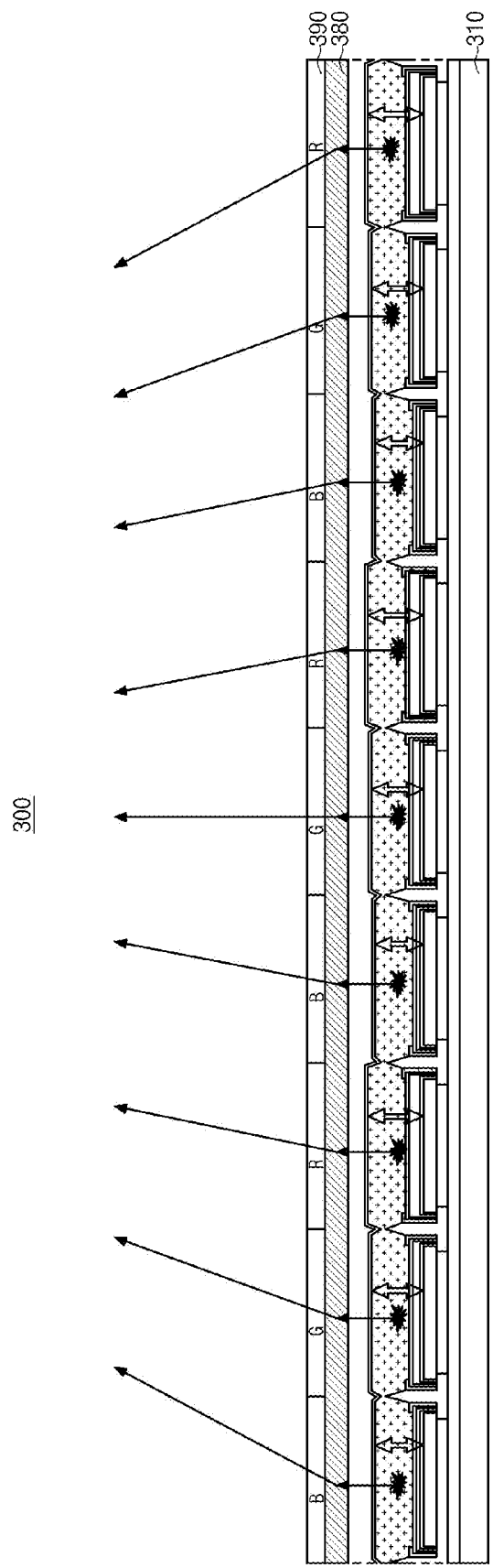

FIGS. 6A to 6C are cross-sectional views schematically illustrating an electroluminescent display device according to a third aspect of the present disclosure.

As illustrated in FIGS. 6A to 6C, an electroluminescent display device 300 according to the third aspect of the present disclosure may include a substrate 310, light emitting diodes D1, D2, and D3 disposed on the substrate 310, an optical path adjusting layer 390 disposed on the light emitting diodes D1, D2, and D3, and a color filter layer 380 disposed on the optical path adjusting layer 390.

A light-emitting layer 342 in each of the light emitting diodes D1, D2, and D3 may include a first groove h1 and a second groove h2 corresponding to a boundary of each of sub-pixel regions SP1, SP2, and SP3.

That is, the first groove h1 may be formed corresponding to the boundary of each of the sub-pixel regions SP1, SP2, and SP3 at an upper surface of the light-emitting layer 342.

In this case, the first groove h1 may have a width that progressively narrows toward a lower portion at which the substrate 310 is disposed.

The second groove h2 may be formed corresponding to the boundary of each of the sub-pixel regions SP1, SP2, and SP3 at a lower surface of the light-emitting layer 342.

In this case, the second groove h2 may have a width that progressively narrows toward an upper portion at which a second electrode 343 is disposed.

Accordingly, the light-emitting layer 342 may have a thickness that progressively decreases corresponding to the boundary of each of the sub-pixel regions SP1, SP2, and SP3 due to the first groove h1 and the second groove h2.

The second electrode 343 may have a depressed portion DP formed corresponding to the boundary of each of the sub-pixel regions SP1, SP2, and SP3 along the morphology of the light-emitting layer 342 including the first groove h1.

In the electroluminescent display device 300 according to the third aspect, a micro-cavity length of the red sub-pixel region SP3 may be the longest, a micro-cavity length of the blue sub-pixel region SP1 may be the shortest, and a micro-cavity length of the green sub-pixel region SP2 may be in the middle.

Accordingly, since output light may be constructively interfered in each of the sub-pixel regions SP1, SP2, and SP3, luminous efficiency in each of the sub-pixel regions SP1, SP2, and SP3 may be optimized, thereby lowering power consumption.

That is, since the sub-pixel regions SP1, SP2, and SP3 have different optical path distances MCB, MCG, and MCR, only a wavelength of particular colored light is amplified and wavelengths of the other colored lights are cancelled or attenuated due to the micro-cavity effect in spaces according to the optical path distances MCB, MCG, and MCR in the sub-pixel regions SP1, SP2, and SP3.

Light that travels to adjacent sub-pixel regions SP1, SP2, and SP3 from among lights output from the light-emitting layer 342 is reflected due to the shape of the depressed portion DP of the second electrode 343 and the air gap formed in the second groove h2 of the light-emitting layer 342 so that optical efficiency is improved while color mixture is prevented.

Particularly, since the optical path adjusting layer 390 is disposed below the color filter layer 380 in the electroluminescent display device 300 according to the third aspect of the present disclosure, a path of light that is output from the light emitting diodes D1, D2, and D3 and incident on the optical path adjusting layer 390 may be adjusted in a predetermined direction as illustrated in FIGS. 6A and 6B.

In this case, the optical path adjusting layer 390 may be formed using any one of a Fresnel lens, a liquid crystal lens, a holographic optical element, and a diffractive optical element.

Accordingly, light output from the electroluminescent display device 300 may also be condensed to a central area as illustrated in FIG. 6C.

Accordingly, by focusing light output from the electroluminescent display device 300 to an area in which an optical system is disposed, the size and weight of an optical system of a head mount display with which images may be viewed through the optical system may be reduced.

Figure 7:
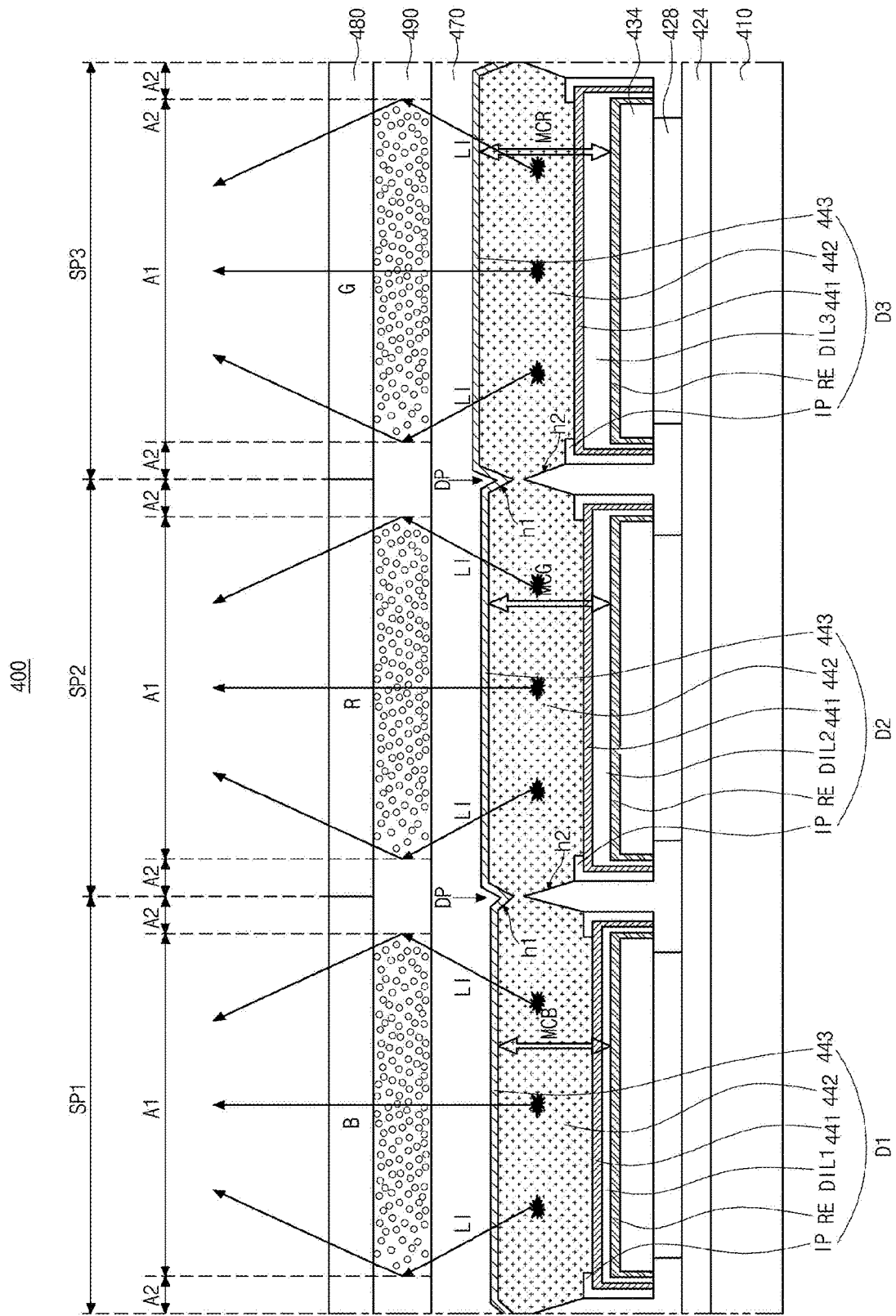
FIG. 7 is a cross-sectional view schematically illustrating an electroluminescent display device according to a fourth aspect of the present disclosure.

FIG. 7 is a cross-sectional view schematically illustrating an electroluminescent display device according to a fourth aspect of the present disclosure.

As illustrated in FIG. 7, an electroluminescent display device 400 according to the fourth aspect of the present disclosure may include a substrate 410, light emitting diodes D1, D2, and D3 disposed on the substrate 410, an optical path adjusting layer 490 disposed on the light emitting diodes D1, D2, and D3, and a color filter layer 480 disposed on the optical path adjusting layer 490.

A light-emitting layer 442 in each of the light emitting diodes D1, D2, and D3 may include a first groove h1 and a second groove h2 corresponding to a boundary of each of sub-pixel regions SP1, SP2, and SP3.

That is, the first groove h1 may be formed corresponding to the boundary of each of the sub-pixel regions SP1, SP2, and SP3 at an upper surface of the light-emitting layer 442.

In this case, the first groove h1 may have a width that progressively narrows toward a lower portion at which the substrate 410 is disposed.

The second groove h2 may be formed corresponding to the boundary of each of the sub-pixel regions SP1, SP2, and SP3 at a lower surface of the light-emitting layer 442.

In this case, the second groove h2 may have a width that progressively narrows toward an upper portion at which a second electrode 443 is disposed.

Accordingly, the light-emitting layer 442 may have a thickness that progressively decreases corresponding to the boundary of each of the sub-pixel regions SP1, SP2, and SP3 due to the first groove h1 and the second groove h2.

The second electrode 443 may have a depressed portion DP formed corresponding to the boundary of each of the sub-pixel regions SP1, SP2, and SP3 along the morphology of the light-emitting layer 442 including the first groove h1.

In the electroluminescent display device 400 according to the fourth aspect, a micro-cavity length of the red sub-pixel region SP3 may be the longest, a micro-cavity length of the blue sub-pixel region SP1 may be the shortest, and a micro-cavity length of the green sub-pixel region SP2 may be in the middle.

Accordingly, since output light may be constructively interfered in each of the sub-pixel regions SP1, SP2, and SP3, luminous efficiency in each of the sub-pixel regions SP1, SP2, and SP3 may be optimized, thereby lowering power consumption.

That is, since the sub-pixel regions SP1, SP2, and SP3 have different optical path distances MCB, MCG, and MCR, only a wavelength of particular colored light is amplified and wavelengths of the other colored lights are cancelled or attenuated due to the micro-cavity effect in spaces according to the optical path distances MCB, MCG, and MCR in the sub-pixel regions SP1, SP2, and SP3.

Light that travels to adjacent sub-pixel regions SP1, SP2, and SP3 from among lights output from the light-emitting layer 442 is reflected due to the shape of a depressed portion DP of the second electrode 443 and an air gap formed in the second groove h2 of the light-emitting layer 442 so that optical efficiency is improved while color mixture is prevented.

Particularly, since the optical path adjusting layer 490 is disposed below the color filter layer 480 in the electroluminescent display device 400 according to the fourth aspect of the present disclosure, a path of light that is output from the light emitting diodes D1, D2, and D3 and incident on the optical path adjusting layer 490 may be adjusted in a predetermined direction as illustrated in FIG. 7.

In this case, the optical path adjusting layer 490 may include a binder, a monomer, an initiator, and a photosensitive dye and may include a binder-concentrated area A2 in which a refractive index is relatively low and a polymer-concentrated area A1 in which a refractive index is relatively high. Accordingly, the refractive index of the binder-concentrated area A2 is lower than that of the polymer-concentrated area A1.

That is, the binder-concentrated area A2 in which the refractive index is low may be formed at the boundary of each of the sub-pixel regions SP1, SP2, and SP3, and light L1 that travels to adjacent sub-pixel regions SP1, SP2, and SP3 from among lights output from the light emitting diodes D1, D2, and D3 may be reflected through the binder-concentrated area A2 so that a path of light is changed to head upper portions of the corresponding sub-pixel regions SP1, SP2, and SP3, thereby further improving optical efficiency while preventing color mixture.

In the present disclosure, an air gap and a depressed portion of a second electrode are formed corresponding to a boundary of a sub-pixel region, and an optical path adjusting layer is formed on a light emitting diode.

Accordingly, light that travels to a sub-pixel region adjacent to a light-emitting layer is reflected so that the light is output to an upper portion of the sub-pixel region corresponding to the light-emitting layer, thereby increasing optical efficiency and adjusting a direction of light output to the outside while preventing color mixture.

Exemplary aspects of the present disclosure have been described above, but one of ordinary skill in the art should understand that the present disclosure may be modified and changed in various ways within the scope not departing from the technical spirit and scope of the present disclosure described in the claims below.

What is claimed is:

1. An electroluminescent display device comprising:
a substrate including first, second, and third sub-pixel regions;
an insulating layer disposed at the first, second, and third sub-pixel regions on the substrate;
a reflective electrode disposed on the insulating layer of each of the first, second, and third sub-pixel regions;
a first electrode disposed over the reflective electrode;
an insulating pattern covering an edge of the first electrode;
a light-emitting layer disposed on the first electrode and the insulating pattern at the first, second, and third sub-pixel regions; and
a second electrode disposed on the light-emitting layer,
wherein each of the first, second and third sub-pixel regions has a different distance between the reflective electrode and the second electrode, and
wherein an air gap is provided between the substrate and the light-emitting layer corresponding to a boundary of each of the first, second and third sub-pixel regions, and
wherein a distance between a bottom end of the air gap and a top end of the air gap is greater than a distance between a bottom end of the insulating pattern and a top end of the insulating pattern.

2. The electroluminescent display device of claim 1, wherein the light-emitting layer includes an upper surface having a first groove corresponding to the boundary of each of the first, second and third sub-pixel regions, and the first groove overlaps the air gap.

3. The electroluminescent display device of claim 2, wherein the second electrode is disposed along a shape of the upper surface of the light-emitting layer and includes a depressed portion corresponding to the first groove and the depressed portion overlaps the air gap.

4. The electroluminescent display device of claim 2, wherein the first groove has a width that progressively narrows toward the first electrode.

5. The electroluminescent display device of claim 2, wherein the light-emitting layer includes a lower surface having a second groove corresponding to the boundary of each of the first, second and third sub-pixel regions.

6. The electroluminescent display device of claim 5, wherein the second groove has a width that progressively narrows toward the second electrode.

7. The electroluminescent display device of claim 5, wherein the second groove forms the air gap.

8. The electroluminescent display device of claim 1, wherein the reflective electrode covers an upper surface and side surfaces of the insulating layer.

9. The electroluminescent display device of claim 8, further comprising first, second, and third dielectric layers corresponding to the first, second, and third sub-pixel regions, respectively,
    wherein each of the first, second, and third dielectric layers is disposed between the reflective electrode and the first electrode, and
    wherein each of the first, second, and third dielectric layers has a different thickness and each of the first, second, and third dielectric layers covers an upper surface and side surfaces of the reflective electrode.

10. The electroluminescent display device of claim 9, wherein the first electrode covers an upper surface and side surfaces of each of the first, second, and third dielectric layers.

11. The electroluminescent display device of claim 1, further comprising an encapsulation layer disposed on the second electrode and a color filter layer disposed on the encapsulation layer.

12. The electroluminescent display device of claim 11, further comprising an optical path adjusting layer disposed to contact the color filter layer,
    wherein the optical path adjusting layer is formed of one of a Fresnel lens, a liquid crystal lens, a holographic optical element (HOE) and a diffractive optical element (DOE).

13. The electroluminescent display device of claim 1, wherein the air gap is extended into the insulating layer.

14. The electroluminescent display device of claim 1, further comprising a thin film transistor between the substrate and the insulating layer at each of the first, second, and third sub-pixel regions,
    wherein the insulating layer has a hole corresponding to the boundary of each of the first, second and third sub-pixel regions, and the hole is spaced apart from the thin film transistor, and
    wherein the hole is disposed between the thin film transistors of adjacent two of the first, second, and third sub-pixel regions.

15. An electroluminescent display device including first, second and third sub-pixel regions, comprising:
    a reflective electrode disposed at each of the first, second, and third sub-pixel regions over a substrate;
    a first electrode functioning as an anode and disposed over the reflective electrode;
    an insulating pattern covering an edge of the first electrode;
    a light-emitting layer disposed on the first electrode and the insulating pattern at the first, second and third sub-pixel regions;
    a second electrode functioning as a cathode and disposed on the light-emitting layer;
    an encapsulation layer disposed on the second electrode; and
    a color filter layer disposed on the encapsulation layer,
    wherein each of the first, second and third sub-pixel regions has a different micro-cavity length defined by a distance between the reflective electrode and the second electrode,
    wherein an air gap is provided between the substrate and the light-emitting layer corresponding to a boundary of each of the first, second and third sub-pixel regions, and
    wherein a distance between a bottom end of the air gap and a top end of the air gap is greater than a distance between a bottom end of the insulating pattern and a top end of the insulating pattern.

16. The electroluminescent display device of claim 15, wherein the light-emitting layer includes an upper surface having a first groove corresponding to the boundary of each of the first, second and third sub-pixel regions, and the first groove overlaps with the air gap.

17. The electroluminescent display device of claim 16, wherein the second electrode includes a depressed portion corresponding to the first groove, and the depressed portion overlaps with the air gap.

18. The electroluminescent display device of claim 16, wherein the first groove has a width that progressively narrows toward the first electrode.

19. The electroluminescent display device of claim 16, wherein the light-emitting layer includes a lower surface having a second groove corresponding to the boundary of each of the first, second and third sub-pixel regions.

20. The electroluminescent display device of claim 19, wherein the second groove has a width that progressively narrows toward the second electrode.

21. The electroluminescent display device of claim 15, wherein the reflective electrode covers an upper surface and side surfaces of a passivation layer between the reflective electrode and the substrate.

22. The electroluminescent display device of claim 21, further comprising first, second, and third dielectric layers corresponding to the first, second, and third sub-pixel regions, respectively, wherein each of the first, second, and third dielectric layers is disposed between the reflective electrode and the first electrode,
    wherein each of the first, second, and third dielectric layers covers an upper surface and side surfaces of the reflective electrode.

23. The electroluminescent display device of claim 22, wherein the first electrode covers an upper surface and side surfaces of each of the first, second, and third dielectric layers.

24. The electroluminescent display device of claim 15, further comprising an optical path adjusting layer disposed to contact the color filter layer,
    wherein the optical path adjusting layer includes a high refractive index area within the sub-pixel regions and a low refractive index area between the sub-pixel regions.

* * * * *